(12) United States Patent
Ramalingam

(10) Patent No.: US 6,238,948 B1
(45) Date of Patent: May 29, 2001

(54) CONTROLLED COLLAPSE CHIP CONNECTION (C4) INTEGRATED CIRCUIT PACKAGE THAT HAS A FILLET WHICH SEALS AN UNDERFILL MATERIAL

(75) Inventor: Suresh Ramalingam, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/262,131

(22) Filed: Mar. 3, 1999

(51) Int. Cl.$^7$ .................................................. H01L 21/44
(52) U.S. Cl. ............................ 438/106; 438/64; 438/117
(58) Field of Search ............................ 438/106, 51, 117, 438/118, 124, 127, 115, 64, 25, 26, 458; 257/687, 688

(56) References Cited

U.S. PATENT DOCUMENTS

| | | | |
|---|---|---|---|
| 5,371,328 | 12/1994 | Gutierrez et al. | 174/261 |
| 5,766,982 | * 6/1998 | Arram et al. | 438/51 |
| 5,821,456 | 10/1998 | Wille et al. | 174/52.2 |
| 5,919,329 | * 10/1998 | Banks et al. | 438/108 |
| 5,998,242 | * 12/1999 | Kirkpatrick et al. | 438/127 |

FOREIGN PATENT DOCUMENTS

| | | |
|---|---|---|
| 0340492A | 11/1989 | (EP) . |
| 0778616A | 6/1997 | (EP) . |
| 063269827 | 10/1988 | (JP) . |
| 01055832 | 3/1989 | (JP) . |
| 02056941 | 2/1990 | (JP) . |
| 03041146 | 2/1992 | (JP) . |
| 08153830 | 6/1996 | (JP) . |

OTHER PUBLICATIONS

International Search Report, PCT/US 00/03813, Feb. 14, 2000.
XP–000912270 "High Reliability Underfill for Flip–Chip Application", Materials Research Society Symposium Proceedings, Sumita et al., 1997.

* cited by examiner

Primary Examiner—David Nelms
Assistant Examiner—Dung A Le
(74) Attorney, Agent, or Firm—Blakely, Sokoloff, Taylor & Zafman LLP

(57) ABSTRACT

A seal process step wherein a fillet material is dispensed on an integrated circuit package which may include an integrated circuit that is mounted to a substrate. The package may include an underfill material that is attached to the integrated circuit and the substrate and a fillet which seals the underfill material and the IC. The uniform seal created by the fillet material may inhibit cracking of the integrated circuit (die) during thermo-mechanical loading.

16 Claims, 2 Drawing Sheets

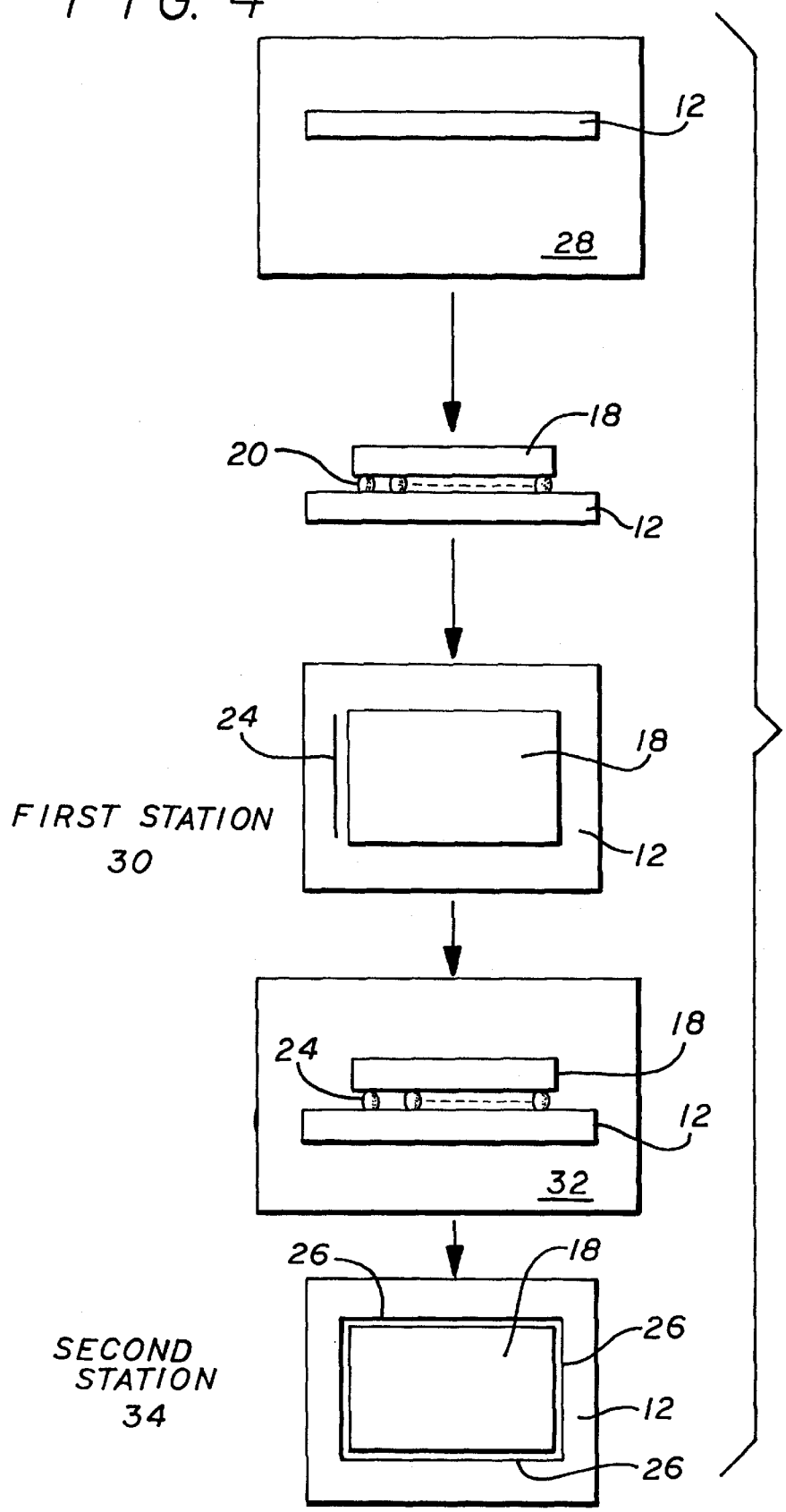

CONTROLLED COLLAPSE CHIP CONNECTION (C4) INTEGRATED CIRCUIT PACKAGE THAT HAS A FILLET WHICH SEALS AN UNDERFILL MATERIAL

BACKGROUND OF THE INVENTION

1. Field of the Invention

The present invention relates to an integrated circuit package.

2. Background Information

Integrated circuits are typically assembled into a package that is soldered to a printed circuit board. FIG. 1 shows a type of integrated circuit package that is commonly referred to as flip chip or C4 package. The integrated circuit 1 contains a number of solder bumps 2 that are soldered to a top surface of a substrate 3.

The substrate 3 is typically constructed from a composite material which has a coefficient of thermal expansion that is different than the coefficient of thermal expansion for the integrated circuit. Any variation in the temperature of the package may cause a resultant differential expansion between the integrated circuit 1 and the substrate 3. The differential expansion may induce stresses that can crack the solder bumps 2. The solder bumps 2 carry electrical current between the integrated circuit 1 and the substrate 3 so that any crack in the bumps 2 may affect the operation of the circuit 1.

The package may include an underfill material 4 that is located between the integrated circuit 1 and the substrate 3. The underfill material 4 is typically an epoxy which strengthens the solder joint reliability and the thermo-mechanical moisture stability of the IC package.

The package may have hundreds of solder bumps 2 arranged in a two dimensional array across the bottom of the integrated circuit 1. The epoxy 4 is typically applied to the solder bump interface by dispensing a single line of uncured epoxy material along one side of the integrated circuit. The epoxy then flows between the solder bumps. The epoxy 4 must be dispensed in a manner that covers all of the solder bumps 2.

It is desirable to dispense the epoxy 4 at only one side of the integrated circuit to insure that air voids are not formed in the underfill. Air voids weaken the structural integrity of the integrated circuit/substrate interface. Additionally, the underfill material 4 must have good adhesion strength with both the substrate 3 and the integrated circuit 1 to prevent delamination during thermal and moisture loading. The epoxy 4 must therefore be a material which is provided in a state that can flow under the entire integrated circuit/substrate interface while having good adhesion properties.

The substrate 3 is typically constructed from a ceramic material. Ceramic materials are relatively expensive to produce in mass quantities. It would therefore be desirable to provide an organic substrate for a C4 package. Organic substrates tend to absorb moisture which may be released during the underfill process. The release of moisture during the underfill process may create voids in the underfill material. Organic substrates also tend to have a higher coefficient of thermal expansion compared to ceramic substrates that may result in higher stresses in the die, underfill and solder bumps. The higher stresses in the epoxy may lead to cracks during thermal loading which propagate into the substrate and cause the package to fail by breaking metal traces. The higher stresses may also lead to die failure during thermal loading and increase the sensitivity to air and moisture voiding. The bumps may extrude into the voids during thermal loading, particularly for packages with a relatively high bump density. It would be desirable to provide a C4 package that utilizes an organic substrate.

SUMMARY OF THE INVENTION

One embodiment of the present invention is an integrated circuit package which may include an integrated circuit that is mounted to a substrate. The package may include an underfill material that is attached to the integrated circuit and the substrate and a fillet which seals the underfill material.

BRIEF DESCRIPTION OF THE DRAWINGS

FIG. 4 is a schematic showing a process for assembling the integrated circuit package.

DETAILED DESCRIPTION OF THE INVENTION

Figure 1:
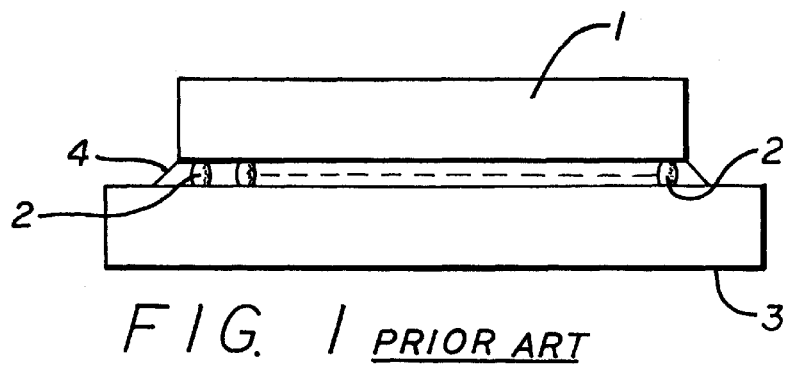
FIG. 1 is a side view of an integrated circuit package of the prior art.
Figure 2:
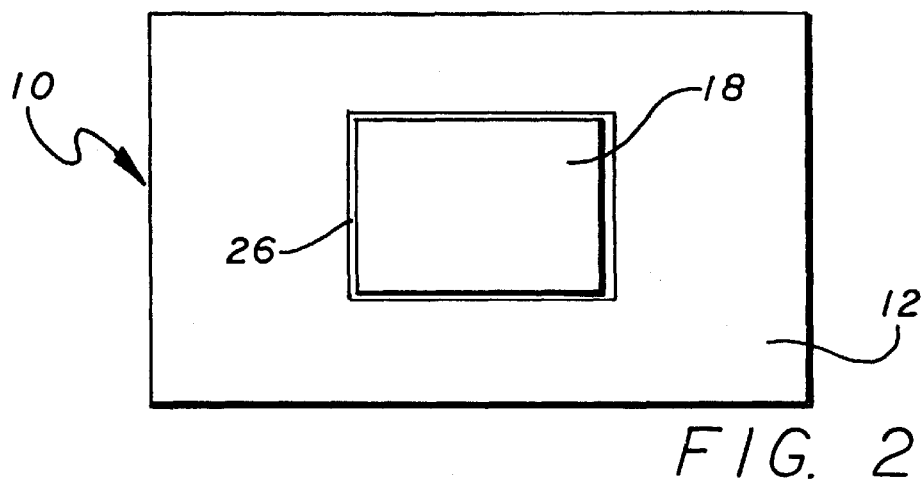
FIG. 2 is a top view of an embodiment of an integrated circuit package of the present invention.
Figure 3:
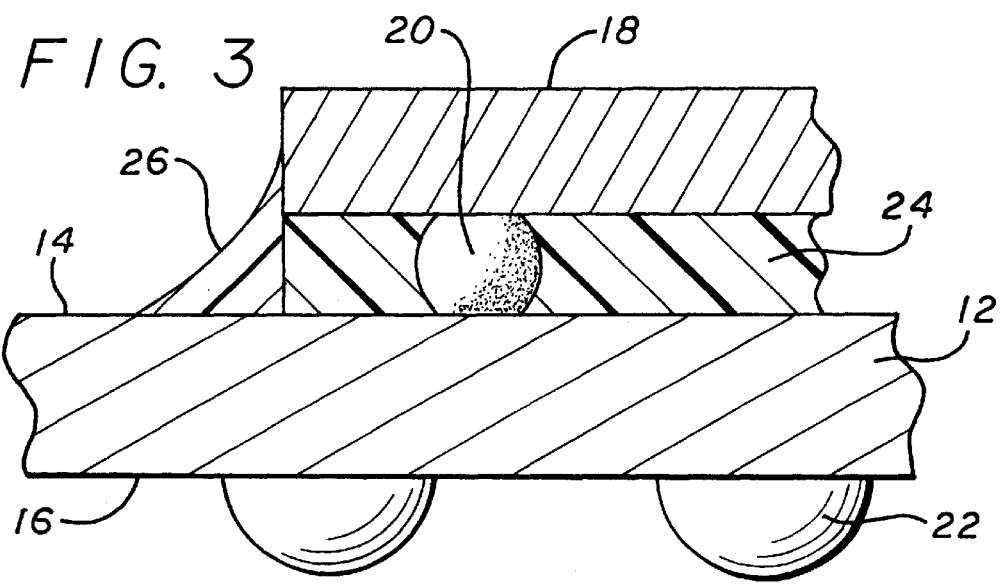
FIG. 3 is an enlarged side view of the integrated circuit package.

Referring to the drawings more particularly by reference numbers, FIGS. 2 and 3 show an embodiment of an integrated circuit package 10 of the present invention. The package 10 may include a substrate 12 which has a first surface 14 and a second opposite surface 16. An integrated circuit 18 may be attached to the first surface 14 of the substrate 12 by a plurality of solder bumps 20. The solder bumps 20 may be arranged in a two-dimensional array across the integrated circuit 18. The solder bumps 20 may be attached to the integrated circuit 18 and to the substrate 12 with a process commonly referred to as controlled collapse chip connection (C4).

The solder bumps 20 may carry electrical current between the integrated circuit 18 and the substrate 12. In one embodimen t the substrate 12 may include an organic dielectric material. The package 10 may include a plurality of solder balls 22 that are attached to the second surface 16 of the substrate 12. The solder balls 22 can be reflowed to attach the package 10 to a printed circuit board (not shown).

The substrate 12 may contain routing traces, power/ground planes, vias, etc. which electrically connect the solder bumps 20 on the first surface 14 to the solder balls 22 on the second surface 16. The integrated circuit 18 may be encapsulated by an encapsulant (not shown). Additionally, the package 10 may incorporate a thermal element (not shown) such as a heat slug or a heat sink to remove heat generated by the integrated circuit 18.

The package 10 may include a first underfill material 24 that is attached to the integrated circuit 18 and the substrate 12. The package 10 may also include a second underfill material 26 which is attached to the substrate 12 and the integrated circuit 18. The second underfill material 26 may form a circumferential fillet that surrounds and seals the edges of the IC and the first underfill material 24. The uniform sealing function of the second underfill material 26 may inhibit moisture migration, cracking of the integrated circuit, and cracking of the first underfill material. The seal process may reduce delamination on IC's mounted with a ceramic substrate as well.

The first underfill material 24 may be an epoxy produced by Shin-Itsu of Japan under the product designation Semicoat 5230-JP. The Semicoat 5230-JP material provides favorable flow and adhesion properties. The second underfill material 26 may be an anhydride epoxy produced by Shin-Itsu under the product designation Semicoat 122X. The Semicoat 122X material has lower adhesion properties than the Semicoat 5230-JP material, but much better fracture/crack resistance.

FIG. 4 shows a process for assembling the package 10. The substrate 12 may be initially baked in an oven 28 to remove moisture from the substrate material. The substrate 12 is preferably baked at a temperature greater than the process temperatures of the remaining underfill process steps to insure that moisture is not released from the substrate 12 in the subsequent steps. By way of example, the substrate 12 may be baked at 163 degrees centigrade (°C.).

After the baking process, the integrated circuit 18 may be mounted to the substrate 12. The integrated circuit 18 is typically mounted by reflowing the solder bumps 20.

The first underfill material 24 may be dispensed onto the substrate 12 along one side of the integrated circuit 18 at a first dispensing station 30. The first underfill material 24 may flow between the integrated circuit 18 and the substrate 12 under a wicking action. By way of example, the first underfill material 24 may be dispensed at a temperature between 110 to 120° C. There may be a series of dispensing steps to fully fill the space between the integrated circuit 18 and the substrate 12.

The package 10 may be moved through an oven 32 to complete a flow out and partial gel of the first underfill material 24. By way of example, the first underfill material 24 may be heated to a temperature of 120–145° C. in the oven 32 to partially gel the first underfill material 24. Partial gelling may reduce void formation and improve the adhesion between the integrated circuit 18 and the first underfill material 24. The improvement in adhesion may decrease moisture migration and delamination between the first underfill material 24 and the IC 18 as well as delamination between the first underfill material 24 and the substrate. The reduction in void formation may decrease the likelihood of bump extrusion during thermal loading. The package may be continuously moved through the oven 32 which heats the underfill material during the wicking process. Continuously moving the substrate 12 during the wicking process decreases the time required to underfill the integrated circuit and thus reduces the cost of producing the package. The substrate 12 can be moved between stations 30 and 34 and through the oven 32 on a conveyer (not shown).

The second underfill material 26 may be dispensed onto the substrate 12 along all four sides of the integrated circuit 18 at a second dispensing station 34. The second underfill material 26 may dispensed in a manner which creates a fillet that encloses and seals the first underfill material 24. By way of example, the second underfill material 26 may be dispensed at a temperature of approximately 80 to 120° C.

The first 24 and second 26 underfill materials may be cured into a hardened state. The materials may be cured at a temperature of approximately 150° C. After the first underfill material 24 and the second underfill material 26 are cured, solder balls 22 may be attached to the second surface 16 of the substrate 12.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A process comprising:

dispensing a first underfill material which becomes attached to an integrated circuit and a substrate; and sealing four edges of the integrated circuit with a second underfill material.

2. The process as recited in claim 1, wherein the first underfill material flows between the integrated circuit and the substrate.

3. The process as recited in claim 2, wherein the substrate moves within an oven while flowing between the integrated circuit and the substrate.

4. The process as recited in claim 1, further comprising heating the substrate before the first underfill material is dispensed.

5. The process as recited in claim 4, further comprising heating the first underfill material to a partial gel state.

6. The process as recited in claim 5, wherein the substrate is heated to a temperature that is greater than temperature of the first underfill material in said partial gel state.

7. The process as recited in claim 1, further comprising mounting the integrated circuit to the substrate with a solder bump before the first underfill material is dispensed.

8. The process as recited in claim 7, further comprising attaching a solder ball to the substrate.

9. A process comprising:

baking a substrate;

mounting an integrated circuit to the substrate;

dispensing a first underfill material onto the substrate; and, sealing four edges of the integrated circuit with a second underfill material.

10. The process as recited in claim 9, wherein the substrate moves within an oven while flowing between the integrated circuit and the substrate.

11. The process as recited in claim 10, further comprising mounting the integrated circuit to the substrate with a solder bump before the first underfill material is dispensed.

12. The process as recited in claim 11, further comprising attaching a solder ball to the substrate.

13. A method comprising:

heating a substrate;

mounting an integrated circuit to the substrate dispensing a first underfill material on the substrate at a temperature; and sealing four edges of the integrated circuit with a second underfill material.

14. The method as recited in claim 13 further comprising curing the first and second underfill materials.

15. The method as recited in claim 13 further comprising attaching a solder ball to a surface of the substrate.

16. The method as recited in claim 13, wherein the temperature is approximately 150 degrees centirade.

* * * * *